(12) United States Patent
Xu

(10) Patent No.: US 7,405,594 B1
(45) Date of Patent: Jul. 29, 2008

(54) CURRENT MODE DRIVER WITH CONSTANT VOLTAGE SWING

(75) Inventor: Chao Xu, Suwanee, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 76 days.

(21) Appl. No.: 11/424,779

(22) Filed: Jun. 16, 2006

(51) Int. Cl.
*H03K 19/0175* (2006.01)
(52) U.S. Cl. .......................................... 326/82; 326/83
(58) Field of Classification Search .................. 326/26, 326/27, 82–90
See application file for complete search history.

(56) References Cited

U.S. PATENT DOCUMENTS

| | | | |
|---|---|---|---|
| 6,507,225 B2 | 1/2003 | Martin | |
| 6,600,346 B1 | 7/2003 | Macaluso | |
| 6,603,348 B1 * | 8/2003 | Preuss et al. | 327/563 |
| 6,788,116 B1 | 9/2004 | Cook | |
| 6,812,733 B1 | 11/2004 | Plasterer | |
| 6,977,534 B2 | 12/2005 | Radelinow | |
| 2003/0085737 A1 * | 5/2003 | Tinsley et al. | 326/86 |
| 2004/0119834 A1 * | 6/2004 | Wang et al. | 348/207.99 |

* cited by examiner

*Primary Examiner*—Don P Le
(74) *Attorney, Agent, or Firm*—Stanley J. Pawlik; Glass & Associates (57) ABSTRACT

A current mode driver generates a differential output signal that has a constant voltage swing between a lower voltage level and an upper voltage level. A feedback module determines an intermediate voltage between the lower voltage level and the upper voltage level, compares the intermediate voltage with a reference voltage, and generates a control signal based on a result of the comparison. The current mode driver maintains the voltage swing of the differential output signal at a constant voltage based on the control signal. The differential output signal may have a data signal component and a pre-emphasis signal component.

16 Claims, 10 Drawing Sheets

FIG. 10

CURRENT MODE DRIVER WITH CONSTANT VOLTAGE SWING

BACKGROUND

1. Field of the Invention

The present invention generally relates to electronic circuits, and more particularly to current mode drivers.

2. Description of Related Art

High-speed data transmitters in modern communications equipment employ current mode drivers for driving a voltage swing of a differential output signal. A current mode driver drives a voltage swing of a differential output signal by driving a differential current through a pair of resistive loads. The current mode driver typically includes a current source and a current mirror for generating a tail current. In operation, the current mode driver channels the tail current through a differential pair of transistors based on a differential input signal to generate the differential current.

Although a current mode driver provides significant advantages over some other types of drivers in terms of switching speed, a current mode driver is susceptible to integrated circuit process variations, supply voltage variations, and operating temperature variations. Such variations in process, voltage, and temperature may affect the amplitude, phase, and frequency of the differential output signal generated by the current mode driver. In particular, these variations may affect a voltage swing of the differential output signal, which may reduce the integrity of the differential output signal.

In light of the above, a need exists for a current mode driver that generates a differential output signal having a constant output voltage swing.

SUMMARY

In various embodiments, a current mode driver generates a differential output signal based on a differential input signal and a control signal. The differential output signal has a voltage swing between a lower voltage level and an upper voltage level. The current mode driver includes a feedback module that determines an intermediate voltage between the lower voltage level and the upper voltage level. Further, the feedback module compares the intermediate voltage with a reference voltage and generates the control signal based on a result of the comparison. The current mode driver maintains the voltage swing of the differential output signal at a constant voltage based on the control signal. In this way, the differential output signal has a constant voltage swing. In a further embodiment, the current mode driver maintains the voltage swing of the differential output signal at a constant voltage over process, voltage, and temperature variations of an integrated circuit containing the current mode driver.

A current mode driver, in accordance with one embodiment, includes a driver module and a feedback module coupled to the driver module. The driver module generates a differential output signal based on a differential input signal and a control signal. The differential output signal has a voltage swing between a lower voltage level and an upper voltage level. The feedback module determines an intermediate voltage between the lower voltage level and the upper voltage level. Further, the feedback module generates the control signal based on the intermediate voltage for maintaining the voltage swing at a substantially constant voltage. In a further embodiment, the intermediate voltage is at a midpoint between the lower voltage level and the upper voltage level.

A current mode driver, in accordance with one embodiment, generates a differential output signal having a voltage swing between a lower voltage level and an upper voltage level. The current mode driver includes a first driver module, a second driver module, and a feedback module. The feedback module is coupled to the first driver module and the second driver module. The first driver module amplifies a first differential input signal based on a first control signal to generate a data signal component of the differential output signal. The second driver module amplifies a second differential input signal based on a second control signal to generate a pre-emphasis signal component of the differential output signal. The feedback module determines an intermediate voltage between the lower voltage level and the upper voltage level. Further, the feedback module generates both the first control signal the second control signal based on the intermediate voltage for maintaining the voltage swing at a substantially constant voltage. In a further embodiment, the intermediate voltage is at a midpoint between the lower voltage level and the upper voltage level.

A method, in accordance with one embodiment, includes generating a differential output signal based on a differential input signal and a control signal. The differential output signal has a voltage swing between a lower voltage level and an upper voltage level. The method also includes determining an intermediate voltage between the lower voltage level and the upper voltage level. Further, the method includes generating the control signal based on the intermediate voltage for maintaining the voltage swing at a substantially constant voltage. In a further embodiment, the intermediate voltage is at a midpoint between the lower voltage level and the upper voltage level.

A system, in accordance with one embodiment, includes a means for generating a differential output signal based on a differential input signal and a control signal. The differential output signal has a voltage swing between a lower voltage level and an upper voltage level. The method further includes a means for determining an intermediate voltage between the lower voltage level and the upper voltage level. Additionally, the apparatus includes a means for generating the control signal based on the intermediate voltage for maintaining the voltage swing at a substantially constant voltage. In a further embodiment, the intermediate voltage is at a midpoint between the lower voltage level and the upper voltage level.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In various embodiments, a current mode driver generates a differential output signal having a voltage swing. Additionally, the current mode driver generates a control signal based on the voltage swing of the differential output signal and a reference voltage. The current mode driver maintains the voltage swing of the differential output signal at a constant voltage based on the control signal. In a further embodiment, the differential output signal includes a data signal component and a pre-emphasis signal component.

Figure 1:
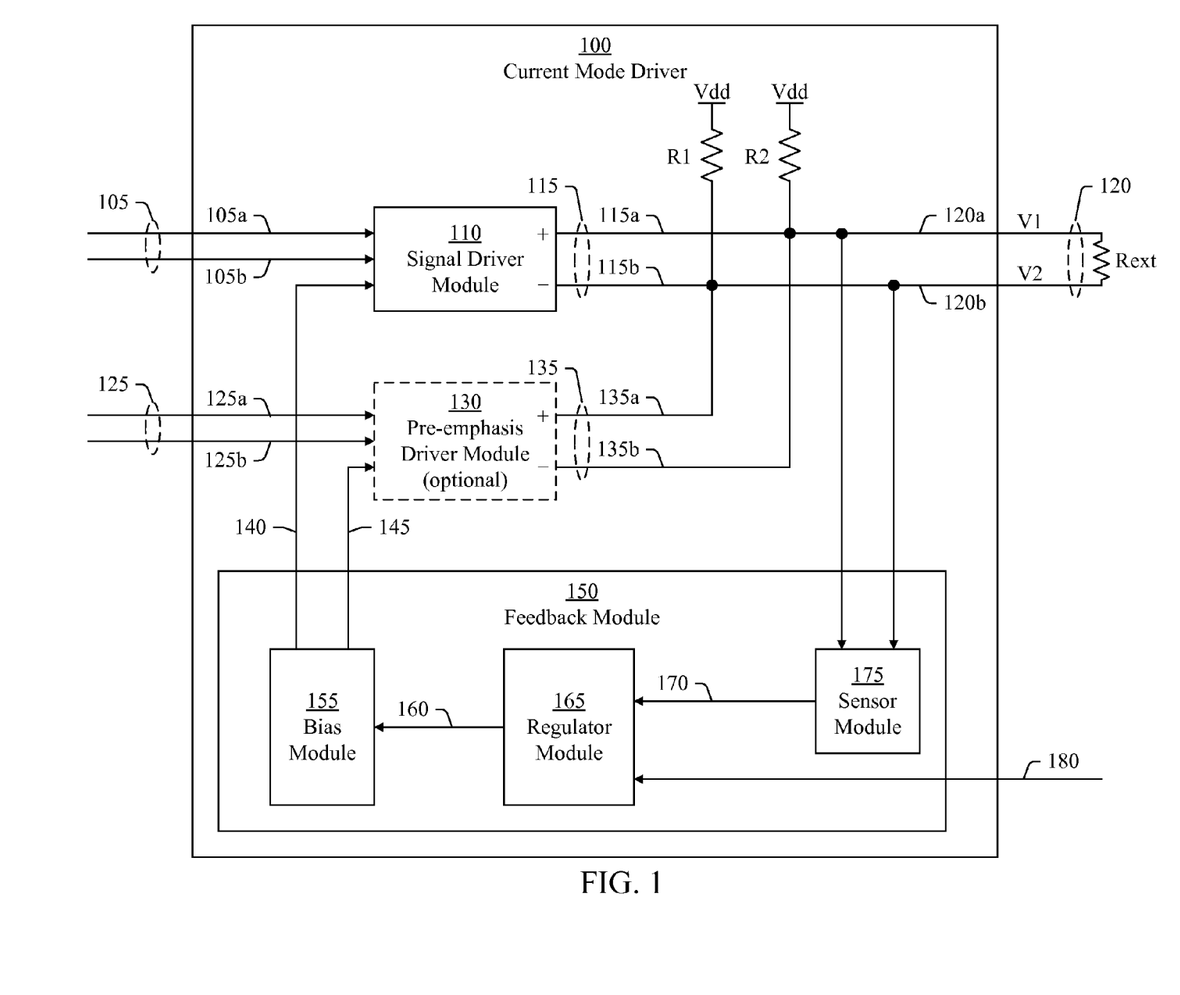
FIG. 1 is a block diagram of a current mode driver, in accordance with an embodiment of the present invention.

FIG. 1 illustrates a current mode driver 100, in accordance with an embodiment of the present invention. The current mode driver 100 includes a signal driver module 110 and a feedback module 150 coupled to the signal driver module 110. The signal driver module 110 generates a differential output signal 120 based on a differential input signal 105 and a control signal 140. The signal driver module 110 generates the differential output signal 120 by driving a differential current into a pair of resistors R1 and R2. As illustrated in FIG. 1, the current mode driver 100 provides the differential output signal 120 to an external resistor Rext (e.g., a resistive load, such as a differential transmission line) external of the current mode driver 100. The feedback module 150 generates the control signal 140 based on the differential output signal 120 and a reference voltage 180. In turn, signal driver module 110 maintains a voltage swing of the differential output signal 120 at a constant voltage based on the control signal 140.

The differential input signal 105 includes differential signal components 105a and 105b. The differential output signal 120 includes differential signal components 120a and 120b, which correspond to the differential signal components 105a and 105b. In various embodiments, the signal driver module 110 generates the differential output signal 120 by amplifying the differential input signal 105. In various embodiments, the signal driver module 110 amplifies a current of the differential input signal 105 or a voltage of the differential input signal 105, or both. In some embodiments, the differential input signal 105 is a digital differential signal and the differential output signal 120 is a small swing differential signal. In these embodiments, the signal driver module 110 converts the differential input signal 105 to the differential output signal 120. Further, the signal driver module 110 may generate the differential output signal 120 such that the differential output signal 120 has a small voltage swing appropriate for driving a differential transmission line, such as board traces or cables.

In various embodiments, the voltage swing of the differential output signal 120 is between a lower voltage level and an upper voltage level of the differential output signal 120. Stated differently, the voltage of the differential output signal 120 swings between the lower voltage level and the upper voltage level. In one embodiment, the upper voltage level is a maximum voltage of the differential signal components 120a and 120b, and the lower voltage level is a minimum voltage of the differential signal components 120a and 120b. Further, the voltage swing has a voltage that is the difference between the upper voltage level and the lower voltage level.

The voltage swing of the differential output signal 120 is based on the resistance of the resistors R1 and R2, the resistance of the external resistor Rext, and the differential current driven into the resistors R1 and R2 by the signal driver module 110. As illustrated in FIG. 1, one end of the resistor R2 receives the differential signal component 120a of the differential output signal 120, and the other end of the resistor R2 is connected to a supply voltage (e.g., Vdd). For example, the supply voltage may be 1.2 volts. One end of the resistor R1 receives the differential signal component 120b of the differential output signal 120, and the other end of the resistor R1 is connected to the supply voltage. Generally, the voltage swing of the differential output signal 120 increases as the resistance of the resistors R1 and R2 increases or as the current driven into the resistors R1 and R2 by the signal driver module 110 increases, or both. In one embodiment, the resistance of each of the resistors R1 and R2 is 50 ohms, and the resistance of the external resistor Rext is 100 ohms.

The feedback module 150 includes a bias module 155, a regulator module 165, and a sensor module 175. The sensor module 175 is coupled to the signal driver module 110 and the regulator module 165. The bias module 155 is coupled to the regulator module 165 and the signal driver module 110. The sensor module 175 generates a signal 170 having an intermediate voltage between the lower voltage level and the upper voltage level of the differential output signal 120. In one embodiment, the intermediate voltage is at a midpoint between the lower voltage level and the upper voltage level. For example, the intermediate voltage may be an average of the lower voltage level and the upper voltage level.

The regulator module 165 generates a signal 160 based on the signal 170 received from the sensor module 175 and the reference voltage 180. The signal 160 indicates a voltage difference between the signal 170 and the reference voltage 180. The bias module 155 generates the control signal 140 based on the signal 160 for maintaining the voltage swing of the differential output signal 120 at a constant voltage. In one embodiment, the control signal 140 includes a bias voltage. In this embodiment, the signal driver module 110 generates the differential output signal 120 based on the bias voltage of the control signal 140 to maintain the voltage swing of the differential output signal 120 at a constant voltage.

In one embodiment, the current mode driver 100 includes an optional pre-emphasis driver module 130 coupled to the feedback module 150. The pre-emphasis driver module 130 generates an output signal component 135 of the differential output signal 120 based on a differential input signal 125 and a control signal 145. The differential input signal 125 includes differential signal components 125a and 125b. The output signal component 135 includes differential signal components 135a and 135b corresponding to the differential signal components 125a and 125b. The pre-emphasis driver module 130 generates the output signal component 135 by driving a differential current into the pair of resistors R1 and R2. In this embodiment, the signal driver module 110 generates an output signal component 115 of the differential output signal 120 instead of generating the differential output signal 120. The output signal component 115 includes differential signal components 115a and 115b corresponding to the differential signal components 105a and 105b. The signal driver module 110 generates the output signal component 115 based on the differential input signal 105 and the control signal 140 by driving a differential current into the pair of resistors R1 and R2.

In various embodiments, the differential output signal 120 is a pre-emphasized data signal. The output signal component 115 is a data signal component of the differential output signal 120, and the output signal component 135 is a pre-emphasis signal component of the differential output signal 120. The signal driver module 110 maintains a voltage swing of the output signal component 115 at a constant voltage based on the control signal 140. Further, the pre-emphasis driver module 130 maintains a voltage swing of the output signal component 135 at a constant voltage based on the control signal 145. In embodiments without the pre-emphasis driver module 130, the output signal component 115 is the differential output signal 120.

In one embodiment, the differential input signal 125 represents the differential input signal 105 delayed by an interval. Further, the signal driver module 110 and the pre-emphasis driver module 130 may amplify the respective differential input signals 105 and 125 to scale the output signal components 115 and 135. In this way, the pre-emphasis driver module 130 generates the pre-emphasis signal component (e.g., the output signal component 135) of the differential output signal 120. The signal driver module 110 may amplify the differential input signal 105 such that the voltage swing of the output signal component 115 is a multiple of the voltage swing of the output signal component 135. For example, the voltage swing of the output signal component 115 may have a magnitude that is five times the magnitude of the voltage swing of the output signal component 135.

In a further embodiment, the differential output signal 120 is a pre-emphasized data signal representing the subtraction of the output signal component 135 from the output signal component 115. Subtraction of the output signal component 135 from the output signal component 115 emphasizes the differential signal components 115a and 115b of the output signal component 115 at transitions between voltage levels (e.g., transitions between the lower voltage level and the upper voltage level). Moreover, the voltage swing of the differential output signal 120 is emphasized at transitions between voltage levels of the differential signal components 120a and 120b, which compensates for high-frequency losses that may occur during transmission of the differential output signal 120. In various embodiments, each of the differential input signals 105 and 125 is a digital differential signal and the differential input signal 125 represents the differential input signal 105 delayed by an interval.

In one embodiment, the current mode driver 100 is contained in an integrated circuit. For example, the integrated circuit may be fabricated on a semiconductor substrate. In this embodiment, the current mode driver 100 maintains the voltage swing of the differential output signal 120 at a constant voltage over process, voltage, and temperature variations of the integrated circuit.

Figure 2:
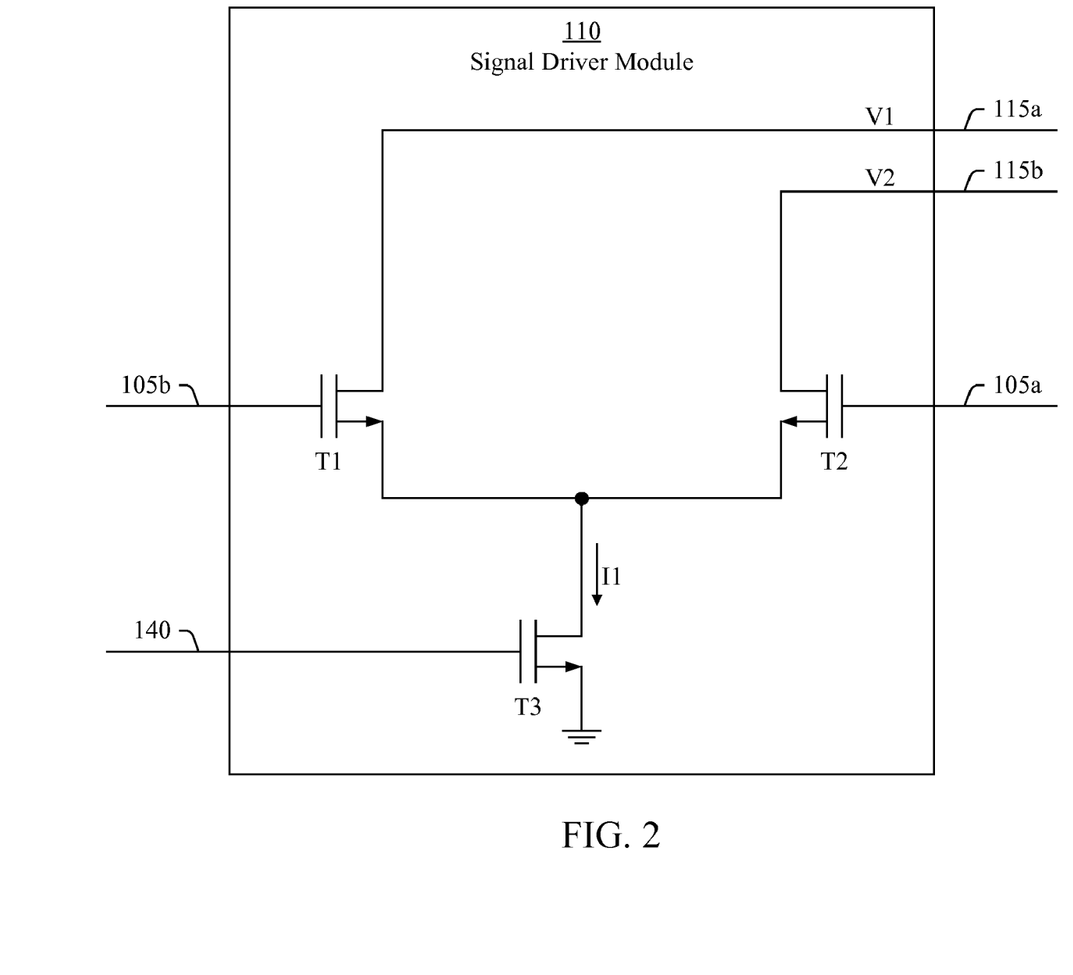
FIG. 2 is a block diagram of a signal driver module, in accordance with an embodiment of the present invention.

FIG. 2 illustrates the signal driver module 110, in accordance with an embodiment of the present invention. The signal driver module 110 includes transistors T1-T3. The transistors T1-T3 are N-Type Metal-Oxide-Semiconductor (NMOS) transistors. In other embodiments, the transistors T1-T3 may be another type of transistor. A drain of the transistor T1 generates the differential signal component 115a of the output signal component 115. A drain of the transistor T2 generates the differential signal component 115b of the output signal component 115. A gate of the transistor T1 receives the differential signal component 105b of the differential input signal 105, and a gate of the transistor T2 receives the differential signal component 105a of the differential input signal 105. A source of each transistor T1 and T2 is connected to a drain of the transistor T3. A source of the transistor T3 is connected to a ground reference. A gate of the transistor T3 receives the control signal 140 and generates a current I1 that flows into the drain of the transistor T3 based on the control signal 140. The current generated at the drain of the transistor T3 is based on a voltage (e.g., a bias voltage) of the control signal 140. Generally, the current I1 increases as the voltage of the control signal 140 increases.

The differential signal components 105a and 105b of the differential input signal 105 control the flow of the current I1 through the transistors T1 and T2 to generate the respective differential signal components 115a and 115b of the output signal component 115. In various embodiments, the transistors T1 and T2 amplify the differential input signal 105 to generate the output signal component 115. The transistors T1 and T2 may amplify the voltage or the current, or both, of the differential input signal 105 to generate the output signal component 115.

As illustrated in FIGS. 1 and 2, the differential signal component 115a of the output signal component 115 has a voltage V1 and the differential signal component 115b of the output signal component 115 has a voltage V2. Moreover, the voltage drop across the resistor R1 is Vdd−V2 and the voltage drop across the resistor R2 is Vdd−V1. The voltage swing VS of the output signal component 115 and the voltages V1 and V2 of the differential signal components 115a and 115b may be expressed by the following equations.

$$V1 = Vdd - R2*I1*(1-\text{delta})$$

$$V2 = Vdd - R1*I1*\text{delta}, \text{ where delta}=(R2+Rext)/(R1+R2+Rext)$$

$$VS = V1 - V2$$

The intermediate voltage of the signal 170 indicates the voltage swing of the output signal component 115. For example, the intermediate voltage of the signal 170 may have a voltage V3 at a midpoint of the voltage swing, which may be expressed by the following equation.

$$V3 = 0.5*(V1+V2)$$

In one embodiment, the resistance of the resistor R1 is the same as the resistance of the resistor R2 and the resistance of Rext is twice the resistance of R1 or R2 (e.g., within the tolerance of the resistors). In this embodiment, the voltage swing VS of the output signal component 115, the voltages V1 and V2 of the differential signal components 115a and 115b, and the voltage V3 of the intermediate voltage may be expressed by the following equations.

$$V1 = Vdd - R1*I1*0.25$$

$$V2 = Vdd - R1*I1*0.75$$

$$VS = 0.5*I1*R1$$

$$V3 = 0.5*(V1+V2) = Vdd - 0.5*R1*I1 = Vdd - VS$$

The voltages V1 and V2 of the differential signal components 115a and 115b, the voltage swing VS of the output signal component 115, and the intermediate voltage V3 of the signal 170 are interrelated and depend in part upon the resistances of the resistors R1, R2, and Rext as well as the current I1. In various embodiments, the current mode driver 100 maintains the voltage swing VS of the output signal component 115 at a constant voltage by adjusting the current I1 such that the intermediate voltage V3 of the signal 170 is substantially the same as the reference voltage 180. In this way, the current mode driver 100 maintains a constant voltage swing of the differential output signal 120 (e.g., VS=Vdd−V3) despite variations in the current I1 or variations in the process characteristics, voltage, or temperature of an integrated circuit containing the current mode driver 100.

Figure 3:
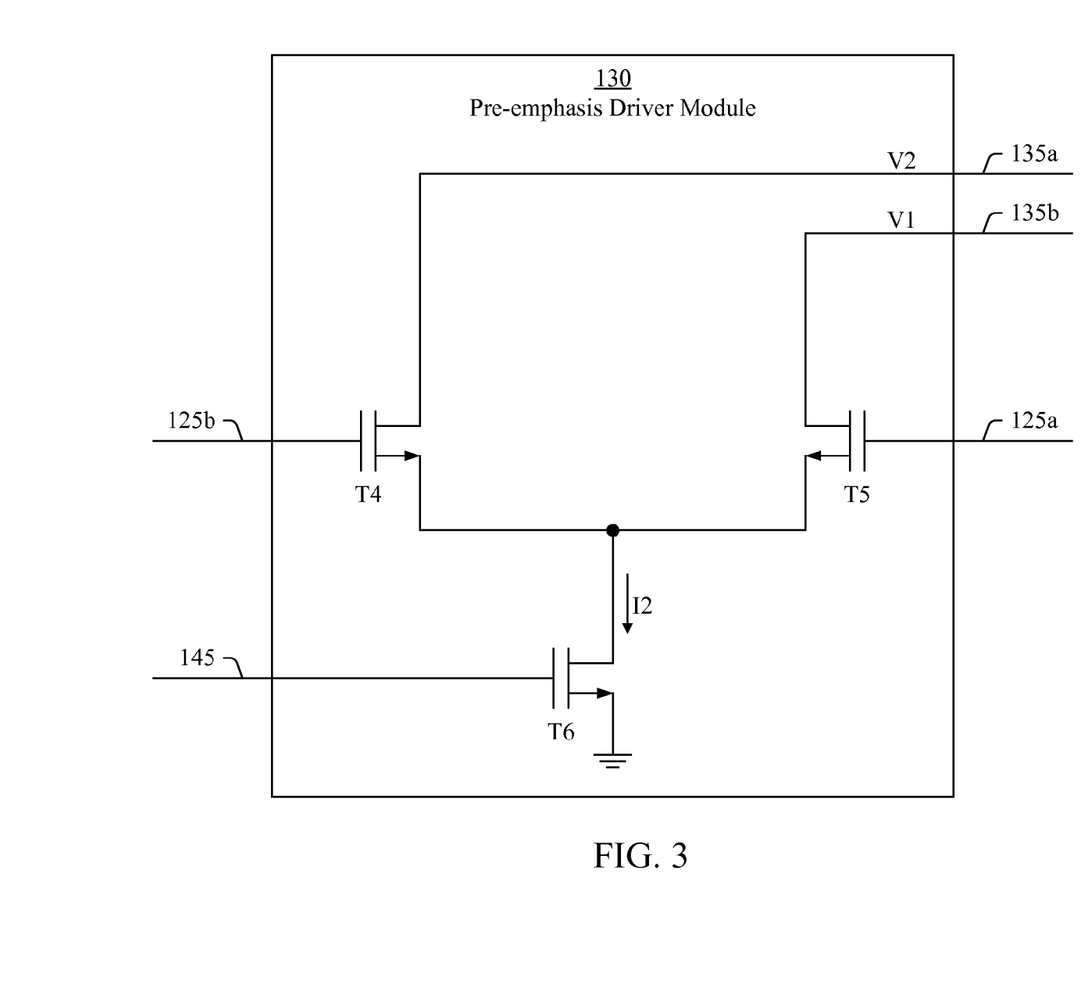
FIG. 3 is a block diagram of a pre-emphasis driver module, in accordance with an embodiment of the present invention.

FIG. 3 illustrates the pre-emphasis driver module 130, in accordance with an embodiment of the present invention. The pre-emphasis driver module 130 includes transistors T4-T6. The transistors T4-T6 are NMOS transistors. In other embodiments, the transistors T4-T6 may be another type of transistor. A drain of the transistor T4 generates the differential signal component 135a of the output signal component 135. A drain of the transistor T5 generates the differential signal component 135b of the output signal component 135. A gate of the transistor T4 receives the differential signal component 125b of the differential input signal 125, and a gate of the transistor T5 receives the differential signal component 125a of the differential input signal 125. A source of each transistor T4 and T5 is connected to a drain of the transistor T6. The source of the transistor T6 is connected to a ground reference. A gate of the transistor T6 receives the control signal 145 and generates a current I2 that flows into the drain of the transistor T6 based on a voltage (e.g., a bias voltage) of the control signal 145. Generally, the current I2 increases as the voltage of the control signal 145 increases.

The differential signal components 125a and 125b of the differential input signal 125 control the flow of the current I2 through the transistors T4 and T5 to generate the respective differential signal components 135a and 135b of the output signal component 135. In various embodiments, the transistors T4 and T5 amplify the differential input signal 125 to generate the output signal component 135. The transistors T4 and T5 may amplify the voltage or the current, or both, of the differential input signal 125 to generate the output signal component 135. In various embodiments, the sizes of the transistors T1, T2, and T3 in the signal driver module 110 are scaled down to determine the sizes of corresponding transistors T4, T5, and T5 in the pre-emphasis module 130.

Figure 4:
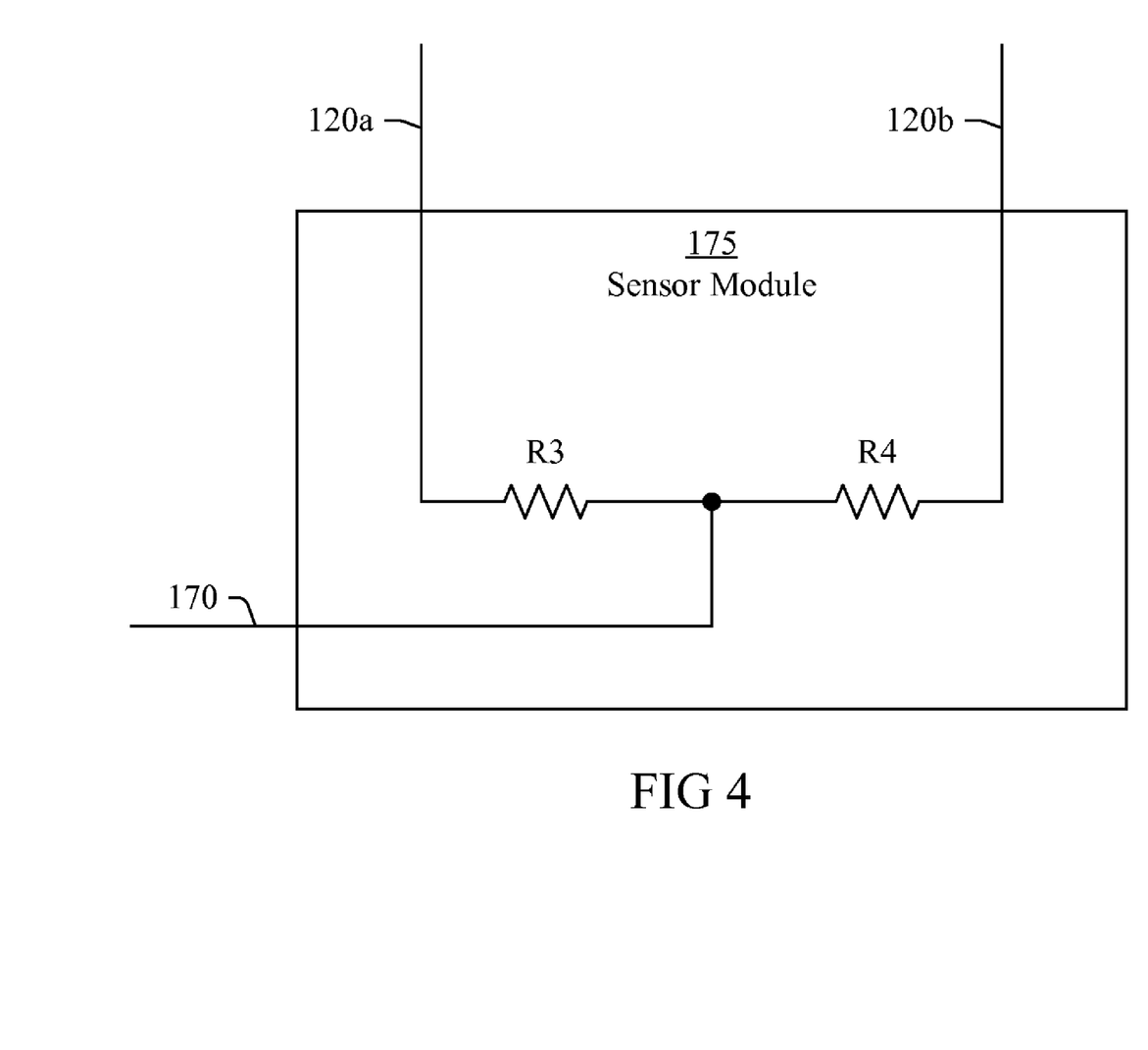
FIG. 4 is a block diagram of a sensor module, in accordance with an embodiment of the present invention.

FIG. 4 illustrates the sensor module 175, in accordance with an embodiment of the present invention. The sensor module 175 includes a resistor R3 and a resistor R4. The resistors R3 and R4 may be any component or device that has a resistance. One end of the resistor R3 receives the differential signal component 120a of the differential output signal 120. The other end of the resistor R3 is connected to one end of the resistor R4 at a junction between the resistors R3 and R4. The other end of the resistor R4 receives the differential signal component 120b of the differential output signal 120. The resistors R3 and R4 determine the intermediate voltage of the signal 170 at the junction between the resistors R3 and R4. In this way, the resistors R3 and R4 form a voltage divider. In various embodiments, the resistance of each of the resistors R3 and R4 is substantially larger than the resistance of each of the resistors R1, R2, and Rext. For example, the resistance of each of the resistors R3 and R4 may be 10,000 ohms. In one embodiment, the resistance of each of the resistors R1 and R2 is 50 ohms, the resistance of the resistor Rext is 100 ohms, and the resistance of each of the resistors R3 and R4 is 10,000 ohms.

In one embodiment, the resistance of the resistor R3 is the same as the resistance of the resistor R4. In this embodiment, the intermediate voltage of the signal 170 is a midpoint between the voltages of the differential signal components 120a and 120b. For example, the intermediate voltage may be an average of the voltages of the differential signal components 120a and 120b. In other embodiments, the resistance of the resistor R3 may be different from the resistance of the resistor R4. In this way, the intermediate voltage of the signal 170 may be biased to be closer to one of the voltages of the differential signal component 120a and 120b.

Figure 5:
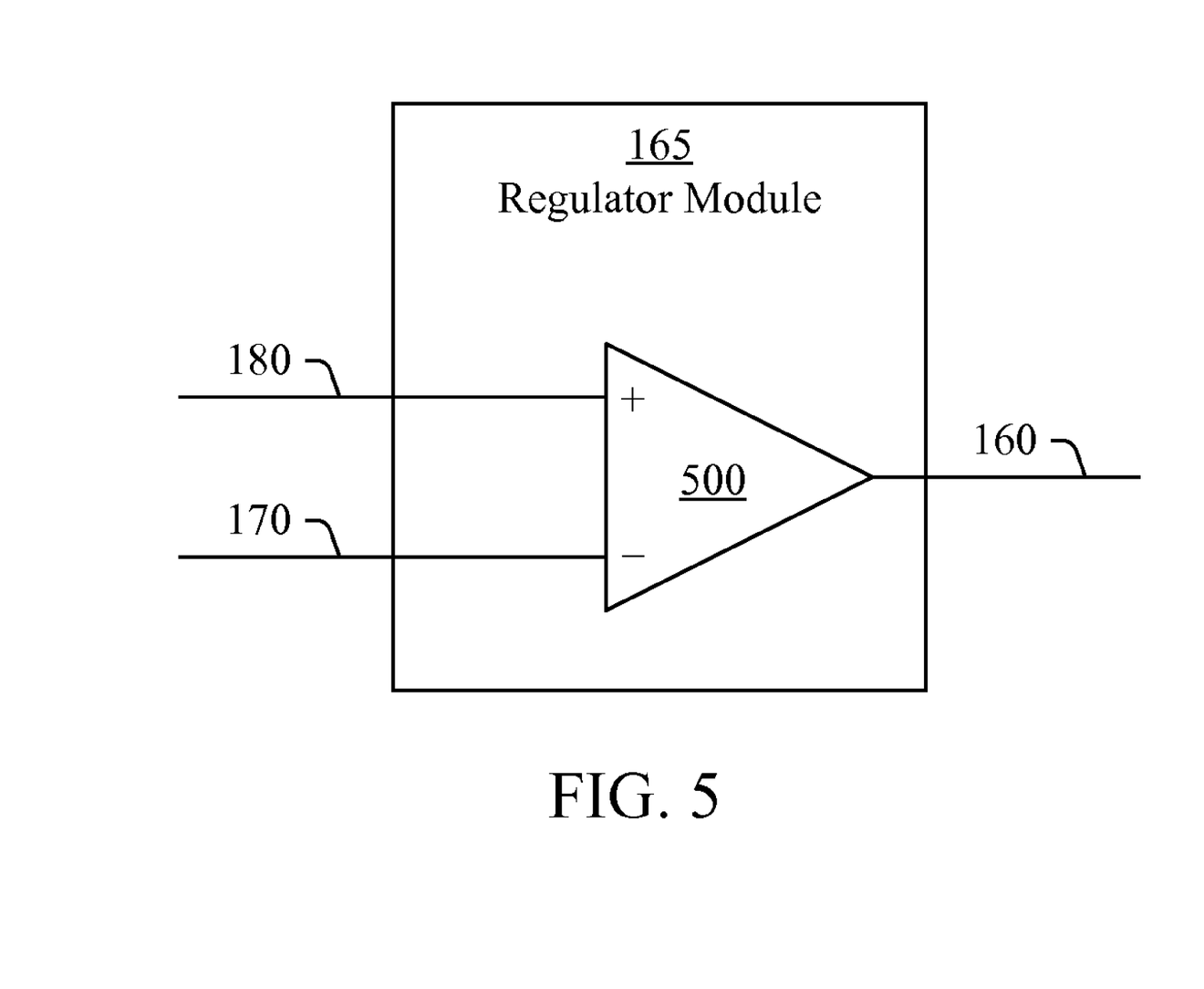
FIG. 5 is a block diagram of a regulator module, in accordance with an embodiment of the present invention.

FIG. 5 illustrates the regulator module 165, in accordance with an embodiment of the present invention. The regulator module 165 includes an amplifier 500 for comparing the signal 170 with the reference voltage 180, and generating the signal 160 based on a result of the comparison. In one embodiment, the amplifier 500 is an operational amplifier that generates the signal 160 indicating an amplified voltage difference between the signal 170 and the reference voltage 180. For example, the operational amplifier 500 may have a gain of 10,000, and the signal 160 may have a voltage (e.g., an error voltage) that is the 10,000 times the voltage difference between the intermediate voltage of the signal 170 and the reference voltage 180. Stated differently, the voltage difference between the signal 170 and the reference voltage 180 is 10,000 times smaller than the voltage of the signal 160. Consequently, the voltage of the signal 170 is substantially the same as the reference voltage 180. For example, the voltage difference between the signal 170 and the reference voltage 180 may be less than 0.12 millivolts (e.g. 0.12 mV).

Because the voltage swing of the differential output signal 120 is based on the voltage difference between the intermediate voltage of the signal 170 and the reference voltage 180, the voltage swing of the differential output signal 120 is substantially constant. For example, the voltage difference between the upper voltage level of the differential signal component 120a and the lower voltage level of the differential signal component 120b may be 0.6 volts (e.g., 0.6 V) and may vary by less than 0.12 millivolts (e.g., 0.12 mV). In other embodiments, the regulator module 165 may contain other components for generating the signal 160.

Figure 6:
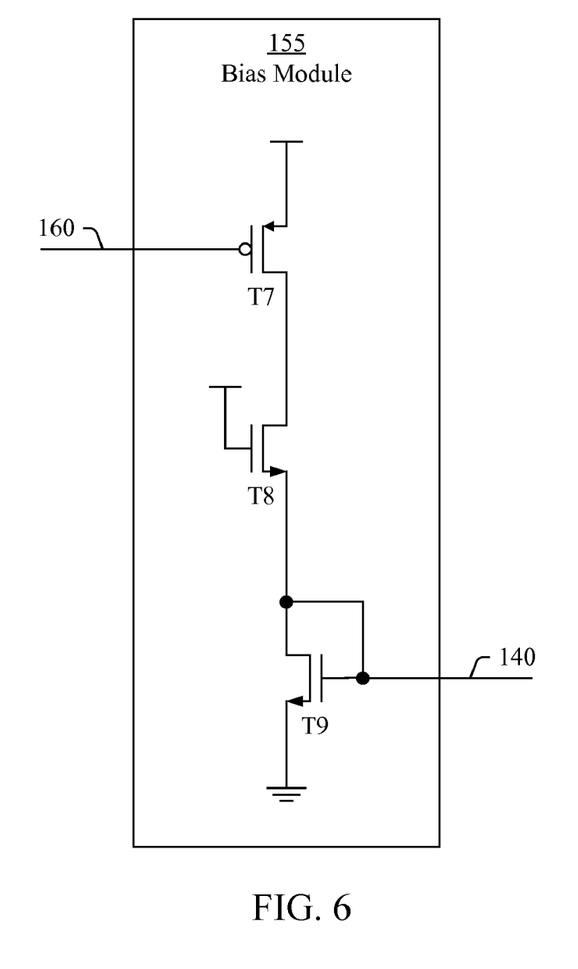
FIG. 6 is a block diagram of a bias module, in accordance with an embodiment of the present invention.

FIG. 6 illustrates the bias module 155, in accordance with an embodiment of the present invention. The bias module 155 generates the control signal 140 in embodiments without the pre-emphasis driver module 130. The bias module 155 includes transistors T7-T9. The transistor T7 is a P-Type Metal-Oxide-Semiconductor (PMOS) transistor, and the transistors T8 and T9 are NMOS transistors. The transistors T7-T9 may be other types of transistor in other embodiments.

A source of the transistor T7 is connected to the supply voltage (e.g., Vdd). A drain of the transistor T7 is connected to a drain of the transistor T8. A gate of the transistor T8 is connected to the supply voltage (e.g., Vdd). A source of the transistor T8 is connected to both a gate and a drain of the transistor T9. A source of the transistor T9 is connected to a ground reference. A gate of the transistor T7 receives the signal 160 and generates a current that flows from the drain of the transistor T7 based on the voltage of the signal 160. The current generated by the transistor T7 flows through the transistor T8 into the drain of the transistor T9. The current generated by the transistor T7 determines the voltage at the gate of the transistor T9, which is the bias voltage of the control signal 140. Thus, the bias module 155 generates the bias voltage of the control signal 140 based on the voltage of the signal 160. In various embodiments, the transistor T8 is optional. In embodiments without the transistor T8, the drain of the transistor T7 is connected to the gate and the drain of the transistor T9.

Figure 7:
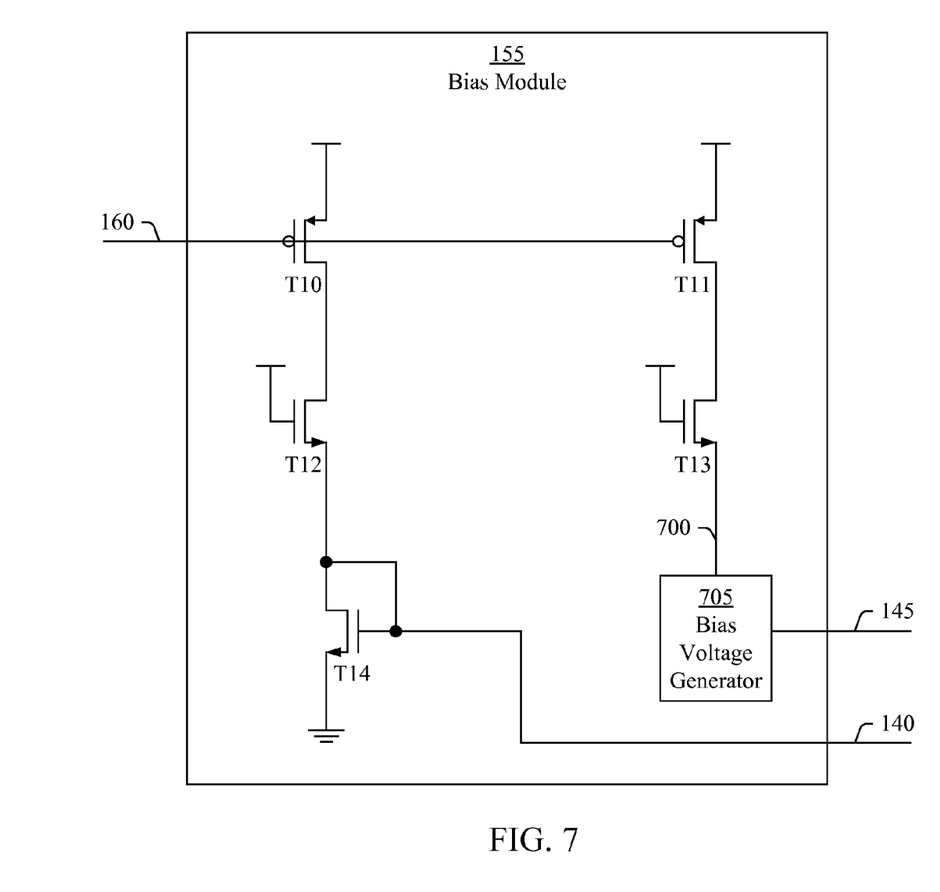
FIG. 7 is a block diagram of a bias module, in accordance with an embodiment of the present invention.

FIG. 7 illustrates the bias module 155, in accordance with an embodiment of the present invention. The bias module 155 generates the control signals 140 and 145 in embodiments including the pre-emphasis driver module 130. The bias module 155 includes transistors T10-T14. The transistors T10 and T11 are PMOS transistors, and the transistors T12-14 are NMOS transistors. The transistors T10-T14 may be other types of transistors in other embodiments.

A source of the transistor T10 is connected to the supply voltage (e.g. Vdd). A drain of the transistor T10 is connected to a drain of the transistor T12. A gate of the transistor T12 is connected to the supply voltage (e.g., Vdd). A source of the transistor T12 is connected to both a gate and a drain of the transistor T14. A source of the transistor T14 is connected to a ground reference. A gate of the transistor T10 receives the signal 160 and generates a current flowing from the drain of the transistor T10 based on the voltage of the signal 160. The current generated by the transistor T10 flows through the transistor T12 into the drain of the transistor T14. The current generated by the transistor T10 determines the voltage at the gate of the transistor T14, which is the bias voltage of the control signal 140. Thus, the bias module 155 generates the bias voltage of the control signal 140 based on the voltage of the signal 160.

A source of the transistor T11 is connected to the supply voltage (e.g. Vdd). A drain of the transistor T11 is connected to a drain of the transistor T13. A gate of the transistor T13 is connected to the supply voltage (e.g., Vdd) and a source of the transistor T13 is connected to a bias voltage generator 705. In various embodiments, the sizes (e.g., the length and width) of the transistors T10-T14 are selected such that the current flowing from the drain of the transistor T11 mirrors the current flowing from the drain of the transistor T10. For example, the size of the transistor T10 may be five times the size of the transistor T11 and the size of the transistor T12 may be five times the size of the transistor T13. In this way, the current flowing from the drain of the transistor T10 is five times the current flowing from the drain of the transistor T11.

The transistor T13 provides a signal 700 to the bias voltage generator 705. The signal 700 has a current that is the same as the current flowing from the drain of the transistor T11. The bias voltage generator 705 generates the bias voltage of the control signal 145 based on the current of the signal 700. In this way, the bias module 155 generates the bias voltage of the control signal 140 based on the voltage of the signal 160. In one embodiment, the bias voltage generator 705 is an NMOS transistor with a gate and drain connected to the source of the transistor T13 and a source connected to a ground potential. In this embodiment, the bias voltage of the control signal 145 is the voltage at the gate of the transistor comprising the bias voltage generator 705.

Figure 8:
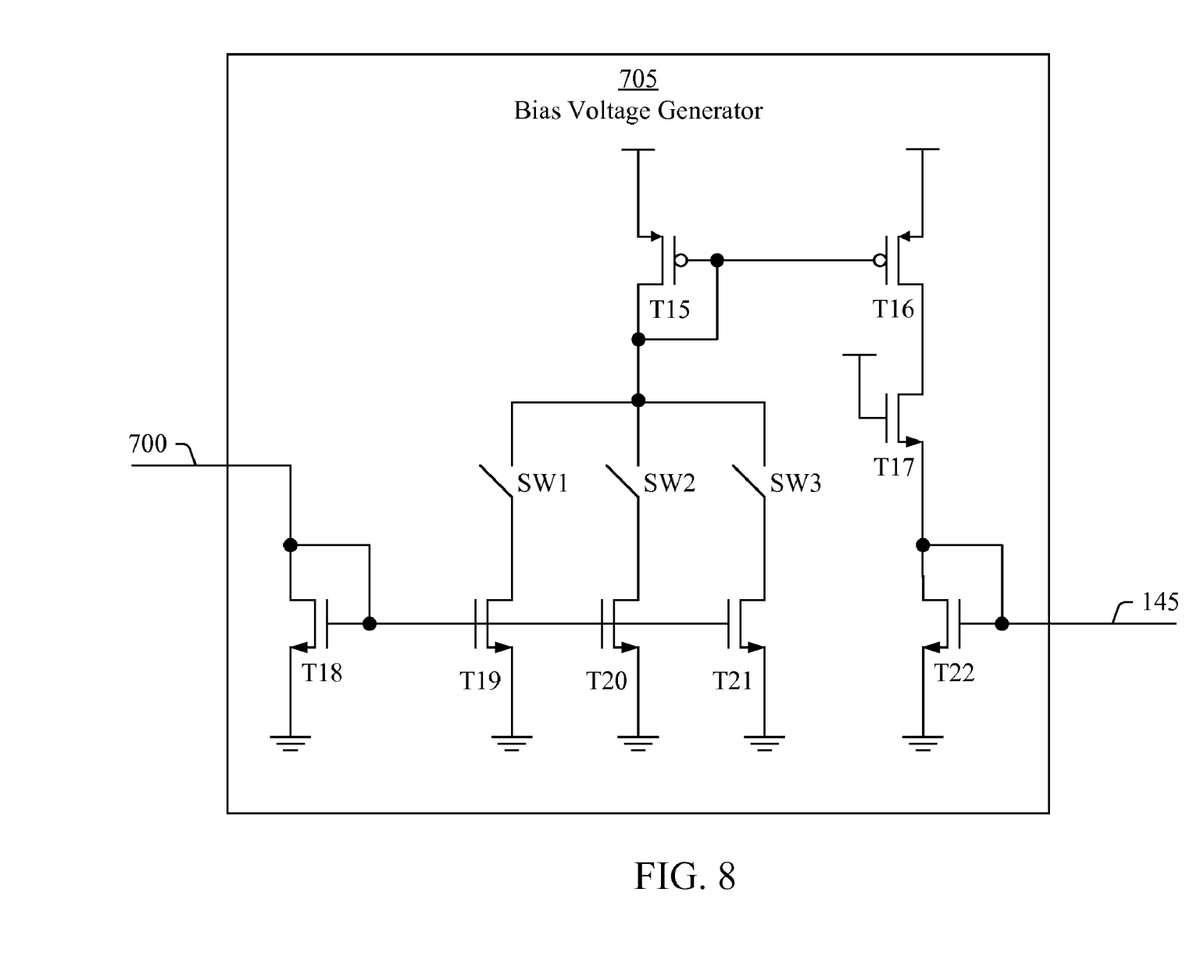
FIG. 8 is a block diagram a bias voltage generator, in accordance with an embodiment of the present invention.

FIG. 8 illustrates the bias voltage generator 705, in accordance with an embodiment of the present invention. The bias voltage generator 705 includes transistors T15-T22 and switches SW1-SW3. The transistors T15 and T16 are PMOS transistors and the transistors T17-T22 are NMOS transistors. The transistors T15-T22 may be other types of transistors in other embodiments. The switches SW1-SW3 may be any type of mechanical, electrical, or electrical-mechanical switches. For example, the switches SW1-SW3 may be transistors, such as NMOS transistors, that may be actuated by one or more control signals (not shown).

The bias voltage generator 705 receives the signal 700 at a drain of the transistor T18. The drain of the transistor T18 is connected to the gate of the transistor T18, and a source of the transistor T18 is connected to a ground reference. The transistor T18 generates a bias voltage at its gate based on the current of the signal 700. Additionally, the gate of the transistor T18 is connected to a gate of each transistor T19, T20, and T21. In this way, the bias voltage at the gate of the transistor T18 biases each of the transistors T19, T20, and T21. A source of each of the transistors T19, T20, and T21 is connected to a ground potential. A drain of the transistor T19 is connected to one end of the switch SW1 and the other end of the switch SW1 is connected to a drain of the transistor 9T15. A drain of the transistor T20 is connected to one end of the switch SW2 and the other end of the switch SW2 is connected to the drain of the transistor T15. A drain of the transistor T21 is connected to one end of the switch SW3 and the other end of the switch SW3 is connected to the drain of the transistor T15. In other embodiments, the bias voltage generator 705 may include more or fewer transistors T19-T21 and more or fewer switches SW1-SW3.

A source of the transistor T15 is connected to the supply voltage (e.g., Vdd) and a gate of the transistor T15 is connected to the drain of the transistor T15. A source of the transistor T16 is connected to the supply voltage and a gate of the transistor T16 is connected to the gate of the transistor T15. A drain of the transistor T16 is connected to a drain of the transistor T17. A gate of the transistor T17 is connected to the supply voltage. A source of the transistor T17 is connected to a gate and a drain of the transistor T22. A source of the transistor T22 is connected to a ground reference. The transistor T22 generates a bias voltage at its gate, which is the bias voltage of the control signal 145.

In various embodiments, the sizes of the transistors T16 and T17 are selected based on the sizes of the transistors T15, T19, T20, and T21 such that a current flowing from the drain of the transistor T16 mirrors a current flowing from the drain of the transistor T15. Moreover, the configuration of the switches SW1-SW3 determines the current flowing from the drain of the transistor T15. Because the current flowing from the drain of the transistor T16 is mirrored to the current flowing from the drain of the transistor T15, the configuration of the switches SW1-SW3 also determines the current flowing from the drain of the transistor T16. In this way, the current flowing from the drain of the transistor T16 is selected based on the configuration of the switches SW1-SW3. Because the bias voltage of the control signal 145 at the gate of the transistor T22 is based on the current flowing from the drain of the transistor T16, the bias voltage of the control signal 145 is selected based on the configuration of the switches SW1-SW3. Thus, the bias voltage generator 705 generates the bias voltage of the control signal 145 based on the current of the signal 700 and the configuration of the switches SW1-SW3. Moreover, because the current of the signal 700 is based on the signal 160, the bias module 155 generates the bias voltage of the control signal 145 based on the signal 160 and the configuration of the switches SW1-SW3.

Figure 9:
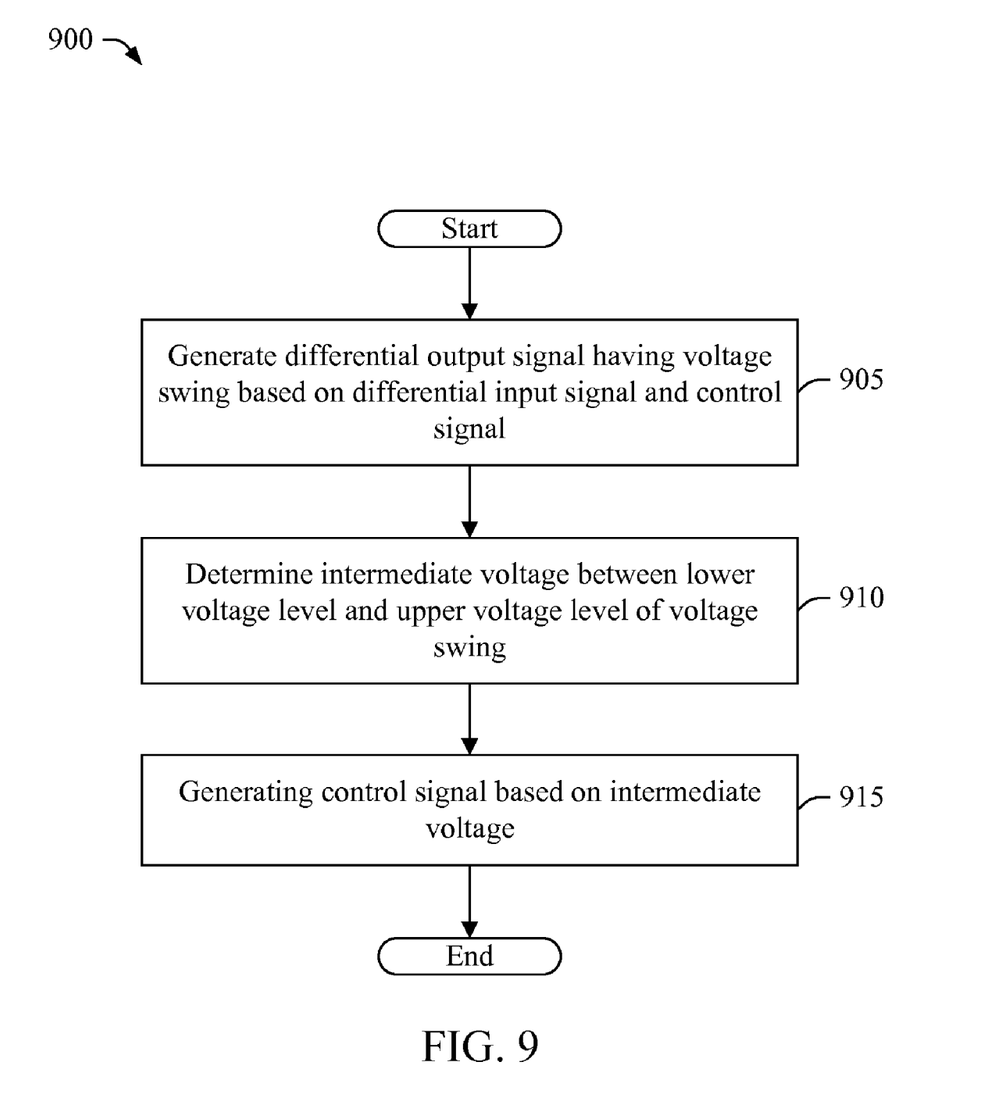
FIG. 9 is a flow chart for a method of generating a differential output signal, in accordance with an embodiment of the present invention.

FIG. 9 illustrates a method 900 of generating the differential output signal 120, in accordance with an embodiment of the present invention. In step 905, the signal driver module 110 generates the differential output signal 120 having a voltage swing based on the differential input signal 105 and the control signal 140. In various embodiments, the signal driver module 110 amplifies the differential input signal 105 to generate the differential output signal 120. The signal driver module 110 may amplify the current of the differential input signal 105, the voltage of the differential input signal 105, or both. In some embodiments, the differential input signal 105 is a digital differential signal and the differential output signal 120 is a small swing differential signal. In these embodiments, the signal driver module 110 converts the differential input signal 105 to the differential output signal 120 by generating a differential current, based on the differential input signal 105, which flows through the resistors R1 and R2 to generate the differential output signal 120. Further, the signal driver module 110 determines the voltage swing of the differential output signal 120 based on the control signal 140, as is described more fully herein. The method 900 then proceeds to step 910.

In step 910, the feedback module 150 determines an intermediate voltage between the lower voltage level and the upper voltage level of the voltage swing of the differential output signal 120. The intermediate voltage is a voltage between a lower voltage level and an upper voltage level of the voltage swing of the differential output signal 120. The intermediate voltage may be a midpoint between the lower voltage level and the upper voltage level, for example an average of the lower voltage level and the upper voltage level. In one embodiment, the sensor module 175 of the feedback module 150 determines the intermediate voltage and generates a signal 170 having the intermediate voltage. The method 900 then proceeds to step 915.

In step 915, the feedback module 150 generates the control signal 140 based on the intermediate voltage for maintaining the voltage swing of the differential output signal 120 at a constant voltage. The control signal 140 indicates a voltage difference between the intermediate voltage and the reference voltage 180. In one embodiment, the regulator module 165 of the feedback module 150 generates the signal 160 indicating an amplified voltage difference between the intermediate voltage of the signal 170 and the reference voltage 180. In turn, the bias module 155 generates the control signal 140 having a bias voltage based on the signal 160. The signal driver module 110 maintains the voltage swing of the differential output signal 120 at a constant voltage based on the bias voltage of the control signal 140.

In various embodiments, the signal driver module 110 adjusts the current I1 in the signal driver module 110 based on the bias voltage of the control signal 140 such that the intermediate voltage of the signal 170 is substantially the same as the reference voltage 180 over process, voltage, or temperature variations of an integrated circuit containing the current mode driver 100. Moreover, because the voltage swing of the differential output signal 120 is based on the intermediate voltage of the signal 170 and the reference voltage 180, the voltage swing of the differential output signal 120 is maintained at a substantially constant voltage over process, voltage, or temperature variations of the integrated circuit. The method 900 then ends. Alternatively, the method 900 returns to step 905 after step 915.

In various embodiments, some or all of the steps 905-915 of the method 900 may be performed in a different order or in parallel with each other. For example, step 905 may be performed after step 915. In other embodiments, various steps 905-915 of the method 900 may be performed in parallel. For example, steps 905-915 may be performed contemporaneously or substantially simultaneously.

Figure 10:
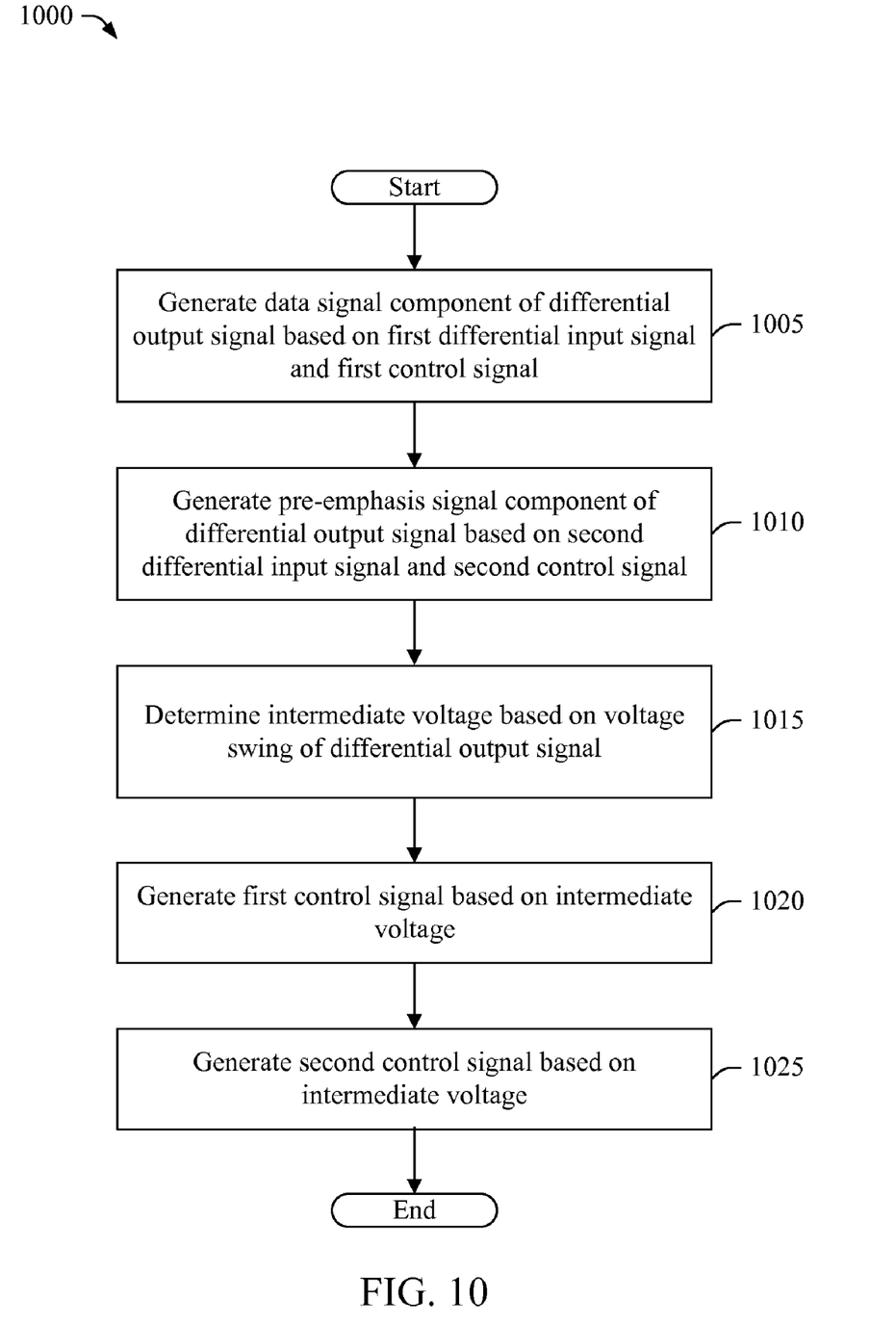
FIG. 10 is a flow chart for a method of generating a differential output signal, in accordance with an embodiment of the present invention.

FIG. 10 illustrates a method 1000 of generating the differential output signal 120, in accordance with an embodiment of the present invention. In step 1005, the signal driver module 110 generates the output signal component 115 of the differential output signal 120. In this embodiment, the output signal component 115 is a data signal component of the differential output signal 120. In some embodiments, the signal driver module 110 amplifies the differential input signal 105 to generate the output signal component 115. The signal driver module 110 may amplify the current of the differential input signal 105, the voltage of the differential input signal 105, or both. Further, the signal driver module 110 determines the voltage swing of the output signal component 115 based on the control signal 140. In some embodiments, the differential input signal 105 is a digital differential signal and the output signal component 115 is a small swing differential signal. In these embodiments, the signal driver module 110 converts the differential input signal 105 to the output signal component 115 by generating a differential current, based on the differential input signal 105, which flows through the resistors R1 and R2. The method 1000 then proceeds to step 1010.

In step 1010, the pre-emphasis driver module 130 generates the output signal component 135 of the differential output signal 120. In this embodiment, the output signal component 135 is a pre-emphasis signal component of the differential output signal 120. In some embodiments, the pre-emphasis driver module 130 amplifies the differential input signal 125 to generate the output signal component 135. The pre-emphasis driver module 130 may amplify the current of the differential input signal 125, the voltage of the differential input signal 125, or both. In some embodiments, the differential input signal 125 is a digital differential signal and the output signal component 135 is a small swing differential signal. In these embodiments, the pre-emphasis driver module 130 converts the differential input signal 125 to the output signal component 135 by generating a differential current, based on the differential input signal 125, which flows through the resistors R1 and R2 to generate the output signal component 135. Further, the pre-emphasis driver module 130 determines the voltage swing of the output signal component 135 based on the control signal 145. Moreover, the voltage swing of the output signal component 115 and the voltage swing of the output signal component 135 determine a voltage swing of the differential output signal 120. The voltage swing of the differential output signal 120 is emphasized at transitions between voltage levels of the differential signal components 120a and 120b of the differential output signal 120. In this way, the differential output signal 120 is a pre-emphasized data signal. The method 1000 then proceeds to step 1015.

In step 1015, the feedback module 150 determines an intermediate voltage between the lower voltage level and the upper voltage level of the voltage swing of the differential output signal 120. The intermediate voltage may be a midpoint between the lower voltage level and the upper voltage level, for example an average of the lower voltage level and the upper voltage level. In one embodiment, the sensor module 175 of the feedback module 150 determines the intermediate voltage and generates a signal 170 having the intermediate voltage. The method 1000 then proceeds to step 1020.

In step 1020, the feedback modules 150 generates the control signal 140 based on the intermediate voltage for maintaining the voltage swing of the output signal component 115 of the differential output signal 120 at a constant voltage. The control signal 140 indicates an amplified difference between the intermediate voltage and the reference voltage 180. In one embodiment, the regulator module 165 of the feedback module 150 generates the signal 160 indicating an amplified voltage difference between the intermediate voltage of the signal 170 and the reference voltage 180. In turn, the bias module 155 generates the control signal 140 having a bias voltage based on the voltage of the signal 160. The signal driver module 110 maintains the voltage swing of the output signal component 115 of the differential output signal 120 at a constant voltage based on the bias voltage of the control signal 140. The method 1000 then proceeds to step 1025.

In step 1025, the feedback modules 150 generates the control signal 145 based on the intermediate voltage for maintaining the voltage swing of the output signal component 135 of the differential output signal 120 at a constant voltage. The control signal 145 indicates an amplified difference between the intermediate voltage and the reference voltage 180. In one embodiment, the regulator module 165 of the feedback module 150 generates the signal 160 indicating an amplified voltage difference between the intermediate voltage of the signal 170 and the reference voltage 180. In turn, the bias module 155 generates the control signal 145 having a bias voltage based on the voltage of the signal 160. The pre-emphasis driver module 130 maintains the voltage swing of the output signal component 135 of the differential output signal 120 at a constant voltage based on the bias voltage of the control signal 145. The method 1000 then ends. Alternatively, the method 1000 returns to step 1005 after step 1025.

In other embodiments, various steps 1005-1025 of the method 1000 may be performed in a different order or in parallel with each other. For example, step 1005 may be performed after step 1010, or step 1020 may be performed after step 1025. In other embodiments, various steps 1005-1025 of the method 100 may be performed in parallel. For example, the steps 1005-1025 may be performed contemporaneously or substantially simultaneously.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A current mode driver comprising:
   a first driver module configured to generate a differential output signal based on a differential input signal and a first control signal, the differential output signal having a voltage swing between a lower voltage level and an upper voltage level; and
   a feedback module coupled to the first driver module and configured to determine an intermediate voltage between the lower voltage level and the upper voltage level, the feedback module further configured to generate the first control signal based on the intermediate voltage for maintaining the voltage swing at a substantially constant voltage, determine a voltage difference between the intermediate voltage and a reference voltage, and generate a first bias voltage based on the voltage difference, the first control signal based on the voltage difference, the first control signal having the first bias voltage, the feedback module comprising:
      a sensor module coupled to the first driver module and configured to determine the intermediate voltage;
      a regulator module coupled to the sensor module and configured to generate the voltage difference; and
      a bias module coupled to the regulator module and the first driver module, the bias module configured to generate the first bias voltage based on the voltage difference.

2. The current mode driver of claim 1, wherein the first driver module is further configured to generate the differential output signal by amplifying the differential input signal.

3. The current mode driver of claim 1, wherein the first driver module is further configured to generate the differential output signal by converting the differential input signal to the differential output signal.

4. The current mode driver of claim 1, wherein the intermediate voltage is a voltage at a midpoint between the lower voltage level and the upper voltage level.

5. A current mode driver configured to generate a differential output signal, the differential output signal having a voltage swing between a lower voltage level and an upper voltage level, the current mode driver comprising:
   a first driver module configured to generate a data signal component of the differential output signal based on a first control signal;
   a second driver module configured to generate a pre-emphasis signal component of the differential output signal based on a second control signal; and
   a feedback module coupled to the first driver module and the second driver module and configured to determine an intermediate voltage between the lower voltage level and the upper voltage level, the feedback module further configured to generate both the first control signal and the second control signal based on the intermediate voltage for maintaining the voltage swing at a substantially constant voltage.

6. The current mode driver of claim 5, wherein the intermediate voltage is a voltage at a midpoint between the lower voltage level and the upper voltage level.

7. The current mode driver of claim 6, wherein the feedback module is further configured to determine a voltage difference between the intermediate voltage and a reference voltage, the first control signal is based on the voltage difference, and the second control signal is based on the voltage difference.

8. The current mode driver of claim 7, wherein the feedback module is further configured to generate a first bias voltage based on the voltage difference, the first control signal having the first bias voltage, the feedback module further configured to generate a second bias voltage, the second control signal having the second bias voltage.

9. The current mode driver of claim 8, wherein the feedback module comprises:
   a sensor module coupled to the first driver module and the second driver module, the sensor module configured to determine the intermediate voltage;
   a regulator module coupled to the sensor module and configured to generate the voltage difference; and
   a bias module coupled to regulator module, the first driver module, and the second driver module, the bias module configured to generate both the first bias voltage and the second bias voltage based on the voltage difference.

10. The current mode driver of claim 9, wherein the bias module is further configured to select the second bias voltage based on a third control signal.

11. A method comprising:
    generating a differential output signal based on a differential input signal and a first control signal, the differential output signal having a voltage swing between a lower voltage level and an upper voltage level;
    determining an intermediate voltage between the lower voltage level and the upper voltage level; and
    generating the first control signal based on the intermediate voltage for maintaining the voltage swing at a substantially constant voltage, wherein generating the first control signal further comprises determining a voltage difference between the intermediate voltage and a reference voltage, and wherein generating the first control signal further comprises generating a first bias voltage based on the voltage difference, the first control signal based on the voltage difference and the first bias voltage.

12. The method of claim 11, wherein generating the differential output signal comprises amplifying the differential input signal.

13. The method of claim 11, wherein generating the differential output signal comprises converting the differential input signal to the differential output signal.

14. The method of claim 11, wherein the intermediate voltage is a voltage at a midpoint between the lower voltage level and the upper voltage level.

15. A system comprising:
means for generating a differential output signal based on a differential input signal and a first control signal, the differential output signal having a voltage swing between a lower voltage level and an upper voltage level;
means for determining an intermediate voltage between the lower voltage level and the upper voltage level;
means for generating a pre-emphasis signal component of the differential output signal; and
means for generating the first control signal based on the intermediate voltage for maintaining the voltage swing at a substantially constant voltage.

16. The system of claim 15, wherein the intermediate voltage is a voltage at a midpoint between the lower voltage level and the upper voltage level.

* * * * *